United States Patent [19]
Chen

[11] Patent Number: 6,150,705
[45] Date of Patent: *Nov. 21, 2000

[54] DIELECTRIC-POLYSILICON-DIELECTRIC-POLYSILICON-DIELECTRIC ANTIFUSE FOR FIELD PROGRAMMABLE LOGIC APPLICATION

[75] Inventor: Wenn-Jei Chen, Sunnyvale, Calif.

[73] Assignee: Actel Corporation, Sunnyvale, Calif.

[ * ] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/571,615

[22] Filed: Dec. 13, 1995

Related U.S. Application Data

[63] Continuation of application No. 08/289,114, Aug. 11, 1994, Pat. No. 5,581,111, which is a continuation-in-part of application No. 08/088,298, Jul. 7, 1993, Pat. No. 5,449,947.

[51] Int. Cl.[7] .................................................. H01L 29/00
[52] U.S. Cl. ............................................................. 257/530
[58] Field of Search ............................................. 257/530

[56] References Cited

U.S. PATENT DOCUMENTS

| | | | |
|---|---|---|---|
| 4,489,481 | 12/1984 | Jones | 29/591 |
| 4,502,208 | 3/1985 | McPherson | 29/584 |
| 4,651,409 | 3/1987 | Ellsworth et al. | 29/576 |
| 4,748,490 | 5/1988 | Hollingsworth | 357/51 |
| 4,796,075 | 1/1989 | Whitten | 357/51 |
| 4,822,753 | 4/1989 | Pintchovski et al. | 437/192 |
| 4,823,181 | 4/1989 | Mohsen et al. | 357/51 |
| 4,847,732 | 7/1989 | Stopper | 361/395 |
| 4,870,302 | 9/1989 | Freeman | 307/465 |
| 4,882,611 | 11/1989 | Blech et al. | 357/51 |

(List continued on next page.)

FOREIGN PATENT DOCUMENTS

| | | | |
|---|---|---|---|
| 0 414 361 | 2/1991 | European Pat. Off. | H01L 23/52 |
| 0 416 903 | 3/1991 | European Pat. Off. | H01L 21/3205 |
| 0 452 091 | 10/1991 | European Pat. Off. | H01L 23/525 |
| 0 455 414 | 11/1991 | European Pat. Off. | H01L 23/525 |

(List continued on next page.)

OTHER PUBLICATIONS

Chen, et al. "A Sublithographic Antifuse Structure for Field–Programmable Gate Array Applications", IEEE Electronic Electron Device Letters, vol. 13, No. 1, Jan. 1992, pp. 53–55.

Cohen, et al., "A Flat–Aluminum Based Voltage–Programmable Link for Field Programmable Devices", IEEE Transactions on Electron Devices, vol. 41, No. 5, May 1994, pp. 721–724.

(List continued on next page.)

*Primary Examiner*—Tom Thomas
*Assistant Examiner*—Ori Nadav
*Attorney, Agent, or Firm*—Johnathan H. Schafer

[57] ABSTRACT

A novel antifuse structure includes a novel antifuse material layer comprises a first dielectric layer, a first polysilicon layer (which may optionally be lightly doped) disposed over the first dielectric layer, and a second dielectric layer disposed over the first polysilicon layer. The dielectric layers may be formed of silicon nitride, silicon dioxide, silicon oxynitride and combinations of the foregoing. Additional layers may also be included to form D/P/D/P/D, D/P/D/a-Si/D sandwiches, and the like. The polysilicon layer provides the ability to control the breakdown voltage of the antifuse through control of the doping level while maintaining a relatively large thickness of the antifuse material layer resulting in low capacitance for the antifuse. The antifuse material layer is compatible with high temperature processes (500° C.–950° C.) and may be carried out in the range of 400° C.–950° C. making it compatible with a wide range of processes.

9 Claims, 1 Drawing Sheet

U.S. PATENT DOCUMENTS

| | | | |
|---|---|---|---|
| 4,899,205 | 2/1990 | Hamdy et al. | 357/51 |
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,057,451 | 10/1991 | McCollum | 437/69 |
| 5,070,384 | 12/1991 | McCollum et al. | 257/530 |
| 5,075,249 | 12/1991 | Sato et al. | 437/52 |
| 5,087,958 | 2/1992 | Chen et al. | 357/51 |
| 5,093,711 | 3/1992 | Hirakawa | 357/71 |
| 5,093,982 | 3/1992 | Gussman | 29/705 |
| 5,095,362 | 3/1992 | Roesner | 357/23.4 |
| 5,100,827 | 3/1992 | Lytle | 437/52 |
| 5,106,773 | 4/1992 | Chen et al. | 437/51 |
| 5,110,754 | 5/1992 | Lowrey et al. | 437/52 |
| 5,120,679 | 6/1992 | Boardman et al. | 437/195 |
| 5,126,290 | 6/1992 | Lowrey et al. | 437/235 |
| 5,134,457 | 7/1992 | Hamdy et al. | 357/51 |
| 5,163,180 | 11/1992 | Eltoukhy et al. | 257/530 |
| 5,166,556 | 11/1992 | Hsu et al. | 307/465 |
| 5,171,715 | 12/1992 | Husher et al. | 437/195 |
| 5,191,550 | 3/1993 | Kubota | 365/96 |
| 5,194,759 | 3/1993 | El-Ayat et al. | 307/202.1 |
| 5,196,724 | 3/1993 | Gordon et al. | 257/530 |
| 5,233,206 | 8/1993 | Lee et al. | 257/50 |
| 5,233,217 | 8/1993 | Dixit et al. | 257/530 |
| 5,241,496 | 8/1993 | Lowrey et al. | 365/96 |
| 5,242,851 | 9/1993 | Choi | 437/49 |
| 5,248,632 | 9/1993 | Tung et al. | 437/195 |
| 5,250,459 | 10/1993 | Lee | 437/52 |
| 5,266,829 | 11/1993 | Hamdy et al. | 257/530 |
| 5,270,251 | 12/1993 | Cohen | 437/173 |
| 5,272,101 | 12/1993 | Forouhi et al. | 437/50 |
| 5,272,666 | 12/1993 | Tsang et al. | 257/530 |
| 5,284,788 | 2/1994 | Spratt et al. | 437/52 |
| 5,286,993 | 2/1994 | Lowrey et al. | 257/390 |
| 5,290,734 | 3/1994 | Boardman et al. | 437/195 |
| 5,293,133 | 3/1994 | Birkner et al. | 324/713 |
| 5,298,784 | 3/1994 | Gambino et al. | 257/529 |
| 5,300,456 | 4/1994 | Tigelaar et al. | 437/195 |
| 5,302,546 | 4/1994 | Gordon et al. | 437/170 |
| 5,304,508 | 4/1994 | Cohen | 437/170 |
| 5,308,795 | 5/1994 | Hawley et al. | 437/195 |
| 5,322,812 | 6/1994 | Dixit et al. | 437/60 |
| 5,327,024 | 7/1994 | Cox | 307/465 |
| 5,328,865 | 7/1994 | Boardman et al. | 437/60 |
| 5,329,153 | 7/1994 | Dixit | 257/530 |
| 5,332,929 | 7/1994 | Chiang | 307/296.3 |
| 5,353,246 | 10/1994 | Tsang et al. | 365/96 |
| 5,381,035 | 1/1995 | Chen et al. | 257/530 |
| 5,387,311 | 2/1995 | Hall et al. | 156/630 |
| 5,390,141 | 2/1995 | Cohen et al. | 365/96 |
| 5,391,513 | 2/1995 | Delgado et al. | 437/60 |
| 5,391,518 | 2/1995 | Bhushan | 437/190 |
| 5,395,797 | 3/1995 | Chen et al. | 437/195 |
| 5,401,993 | 3/1995 | Yamauchi et al. | 257/530 |
| 5,403,778 | 4/1995 | Kwok et al. | 437/188 |
| 5,404,029 | 4/1995 | Husher et al. | 257/50 |
| 5,412,245 | 5/1995 | Favreau | 257/530 |
| 5,412,593 | 5/1995 | Magel et al. | 365/96 |
| 5,427,979 | 6/1995 | Chang | 257/530 |
| 5,482,884 | 1/1996 | McCollum et al. | 437/60 |
| 5,485,031 | 1/1996 | Zhang et al. | 257/530 |
| 5,521,440 | 5/1996 | Iranmanesh | 257/774 |
| 5,525,830 | 6/1996 | Chen et al. | 257/530 |
| 5,572,062 | 11/1996 | Iranmanesh | 257/530 |
| 5,602,053 | 2/1997 | Zheng et al. | 437/60 |
| 5,705,849 | 1/1998 | Zheng et al. | 257/530 |
| 5,726,484 | 3/1998 | Hart et al. | 257/530 |
| 5,763,299 | 6/1998 | McCollum et al. | 438/131 |
| 5,763,898 | 6/1998 | Forouhi et al. | 257/50 |
| 5,789,764 | 8/1998 | McCollum | 257/76 |
| 5,789,796 | 8/1998 | Kang et al. | 257/530 |
| 5,811,870 | 9/1998 | Bhattacharyya et al. | 257/530 |
| 5,821,558 | 10/1998 | Han et al. | 257/52 |
| 5,831,325 | 11/1998 | Zhang | 257/530 |
| 5,834,824 | 11/1998 | Shepherd et al. | 257/530 |
| 5,844,297 | 12/1998 | Crafts et al. | 257/530 |
| 5,847,987 | 12/1998 | Cutter et al. | 365/96 |
| 5,852,323 | 12/1998 | Conn | 247/530 |
| 5,866,937 | 2/1999 | McCollum | 257/530 |

FOREIGN PATENT DOCUMENTS

| | | | |
|---|---|---|---|
| 0 500 034 | 8/1992 | European Pat. Off. | H01L 23/525 |
| 0 501 120 | 9/1992 | European Pat. Off. | H01L 23/525 |
| 0 528 417 | 2/1993 | European Pat. Off. | G11C 17/16 |
| 0 539 197 | 4/1993 | European Pat. Off. | H01L 23/525 |
| WO 95/14310 | 5/1995 | European Pat. Off. | H01L 27/12 |
| WO 96/41374 | 12/1996 | European Pat. Off. | H01L 23/525 |
| 0857357 | 4/1997 | European Pat. Off. | H01L 29/00 |
| 0858675 | 5/1997 | European Pat. Off. | H01L 23/525 |
| 0860025 | 5/1997 | European Pat. Off. | H01L 23/525 |
| 0 823 733 A2 | 2/1998 | European Pat. Off. | H01L 23/525 |
| 2 367 352 | 10/1977 | France | H01L 27/06 |
| 58-28750 | 6/1983 | Japan | H01L 27/10 |
| 60-74669 | 4/1985 | Japan | H01L 27/10 |
| 62-49651 | 3/1987 | Japan | H01L 27/10 |
| 2-208962 | 8/1990 | Japan | H01L 27/10 |
| 7-58209 | 3/1995 | Japan | H01L 21/82 |
| 9-505445 | 5/1997 | Japan | H01L 21/82 |
| 9-507968 | 8/1997 | Japan | H01L 21/82 |
| 10-056066 | 2/1998 | Japan | H01L 21/82 |
| 10-502219 | 2/1998 | Japan | H01L 27/10 |
| 10-084043 | 3/1998 | Japan | H01L 21/82 |
| 10-284604 | 10/1998 | Japan | H01L 21/82 |
| 2 038 552 | 12/1979 | United Kingdom | H01L 29/62 |
| 2 222 024 | 2/1990 | United Kingdom | H01L 21/82 |
| 85/03599 | 8/1985 | WIPO | H01L 29/68 |
| 87/00969 | 2/1987 | WIPO | H01L 23/52 |
| 87/02827 | 5/1987 | WIPO | H01L 27/24 |
| 87/06059 | 10/1987 | WIPO | H01L 21/82 |
| 92/13359 | 8/1992 | WIPO | H01L 21/285 |
| 92/20109 | 11/1992 | WIPO | H01L 45/00 |
| 93/03499 | 2/1993 | WIPO | H01L 23/525 |
| 93/04499 | 3/1993 | WIPO | H01L 21/70 |
| 93/05514 | 3/1993 | WIPO | G11C 17/16 |

OTHER PUBLICATIONS

Gordon, et al., "Conducting Filament of the Programmed Metal Electrode Amorphous Silicon Antifuse", IDEM, 1993 IEEE, pp. 27–30.

Hu, Chenming, "Interconnect Devices for Field Programmable Gate Array", IEDM, 1992, pp. 591–594.

DIELECTRIC-POLYSILICON-DIELECTRIC-POLYSILICON-DIELECTRIC ANTIFUSE FOR FIELD PROGRAMMABLE LOGIC APPLICATION

CROSS-REFERENCE TO RELATED APPLICATION

This application is a continuation of U.S. patent application Ser. No. 08/289,114, filed Aug. 11, 1994, U.S. Pat. No. 5,581,111 which is, in turn, a continuation-in-part of U.S. patent application Ser. No. 08/088,298 filed Jul. 7, 1993, now U.S. Pat. No. 5,449,947 in the name of inventors Wenn-Jei Chen, Steve S. Chiang and Esam Elashmawi, all commonly owned herewith.

BACKGROUND OF THE INVENTION

1. Field of the Invention

The present invention relates generally to the field of semiconductor technology. More specifically, it relates to one-time electrically programmable antifuse technology for use in field programmable logic applications. Still more specifically, the present invention is directed to a novel antifuse and method of fabricating such a novel antifuse.

2. The Prior Art

Numerous processes for the fabrication of antifuses are known in the art. Some of these processes may easily be integrated into already existing integrated circuit fabrication processes. Some antifuse elements incorporate a dielectric antifuse material which contains a nitride or oxide material such as silicon nitride ("SiN") or silicon dioxide ("SiOi$_2$"), either as a single layer, or as a part of a multilayer dielectric such as those described in U.S. Pat. No. 4,823,181 to Mohsen et al., entitled PROGRAMMABLE LOW IMPEDANCE ANTIFUSE ELEMENT and U.S. Pat. No. 4,899,205 to Hamdy et al., entitled ELECTRICALLY-PROGRAMMABLE LOW-IMPEDANCE ANTI-FUSE ELEMENT. Such antifuse structures exhibit excellent leakage and reliability characteristics, and are thus preferred for user-programmable antifuse applications.

Polysilicon ("Poly")/Oxide-Nitride-Oxide("ONO")/N+ diffusion antifuse has long been a primary choice for production antifuse structures. Essentially it consists of a top electrode formed of Poly, an antifuse material layer consisting of a sandwich of SiO$_2$, SiN, and SiO$_2$ and a lower antifuse electrode consisting of an N+ diffusion region. Unfortunately, as the demand for higher density devices and, hence, a smaller antifuse structure forces the construction of smaller antifuses, this process has not proved highly scalable in both the antifuse material layer thickness (which determines breakdown or programming voltage of the antifuse) and the width of the antifuse cell. This is manifested as follows: when the active antifuse cell opening is enlarged, the defect density of the product with the same antifuse population increases. The defect density of the product also increases when the antifuse thickness is shrunk and the bottom oxide of the antifuse is grown over the N+ diffusion area. The present invention is directed toward reducing the problems arising from the scaling down of current ONO-based antifuse technology and providing the needed performance and reliability for next generation antifuse process.

OBJECTS AND ADVANTAGES OF THE INVENTION

Accordingly, it is an object of the present invention to provide an antifuse and process for making same which can be scaled down in size to 0.6 $\mu$m and below without increase in defect rate and without requiring exotic process steps.

It is a further object of the present invention to provide an antifuse structure and process for making same which has reduced capacitance over equivalent ONO-type antifuses.

A further object of the present invention is to provide an antifuse structure and a method of making same which has reduced capacitance, a higher thickness of the antifuse material layer, without the necessity for increasing the breakdown or programming voltage of the antifuse.

A further object of the present invention is to provide an antifuse structure and a method of making same which can be carried out with relatively high temperature process up to about 950° C. or by rapid thermal processing (RTP).

A further object of the present invention is to provide an antifuse structure and a method of making same which has an antifuse material layer formed of a dielectric/Poly/dielectric sandwich resulting in an antifuse material layer exhibiting much more favorable or no time dependent dielectric breakdown ("TDDB") behavior during circuit operation.

Yet a further object of the present invention is to provide an antifuse structure and a method of making same which has increased reliability due to the presence of a doped Poly layer in the middle of the antifuse material layer sandwich.

These and many other objects and advantages of the present invention will become apparent to those of ordinary skill in the art from a consideration of the drawings and ensuing description of the invention.

SUMMARY OF THE INVENTION

In accordance with the present invention a novel antifuse material layer comprises a first dielectric layer, a first polysilicon layer (which may optionally be lightly doped) disposed over the first dielectric layer, and a second dielectric layer disposed over the first polysilicon layer. The dielectric layers may be formed of silicon nitride, silicon dioxide, silicon oxynitride and combinations of the foregoing. Additional layers may also be included to form D/P/D/P/D, D/P/D/a-Si/D sandwiches, and the like. The polysilicon layer provides the ability to control the breakdown voltage of the antifuse through control of the doping level while maintaining a relatively large thickness of the antifuse material layer resulting in low capacitance for the antifuse. The antifuse material layer is compatible with high temperature processes (500° C.–950° C.) and may be carried out in the range of 400° C.–950° C. making it compatible with a wide range of processes.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
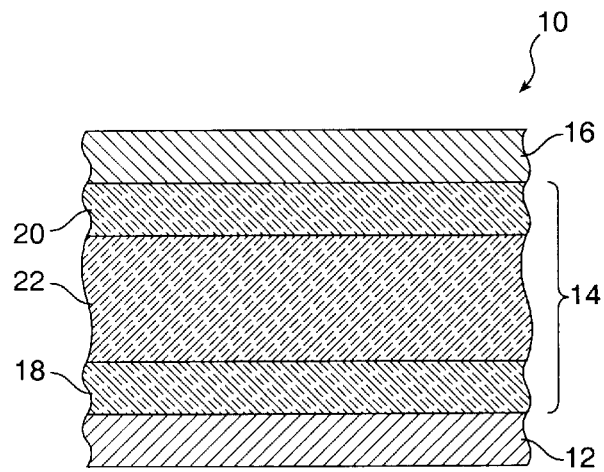
FIG. 1 is a figure of an antifuse in accordance with a first preferred embodiment of the present invention.

With reference to FIG. 1, antifuses 10 are basic microcircuit components which comprise a bottom electrode 12, an antifuse material layer 14, and a top electrode 16. In use, they are one-time programmable elements which start out life as representing an open circuit between the bottom electrode 12 and the top electrode 16. Antifuses may be programmed to the conducting state by applying a voltage across the top and bottom electrodes in excess of the breakdown voltage of the dielectric antifuse material layer 14. When a breakdown voltage is applied, the antifuse material layer ruptures and a conductive link is formed in the rupture zone to conduct electrical current between the bottom and top electrodes.

Some prior art antifuses make use of a top and a bottom electrode formed of a metal. While beneficial in many respects, such metal-to-metal antifuses present some difficulties in manufacturing, among them the need to conduct the process of fabricating the device containing the metal-to-metal antifuse at a temperature of less than about 420° C. in order to prevent damage to the metal electrodes. This damage would arise if the lower metal electrode were processed much above about 420° C. due to diffusion into underlying structures of the semiconductor.

Some prior art antifuses make use of an antifuse material layer formed of a sandwich of ONO, others make use of pure dielectrics based antifuse material layers (e.g., oxide, nitride, etc.). While fit for their intended purposes, such antifuse material layers can exhibit TDDB behavior which manifests itself as a device failure occurring after the device has left the factory and after it has tested good. Thus TDDB presents a serious reliability problem to the use of devices incorporating antifuses.

The present invention is directed to a new type of antifuse material layer which can be used in a number of types of antifuses. It provides a high resistance to TDDB behavior, does not require the use of exotic process steps, and can ba carried out over a wide range of temperatures (from about 400° C. to about 950° C.) yielding the ability to use more reliable high temperature processing for a more reliable antifuse.

In accordance with the present invention, antifuse material layer 14 is replaced with an antifuse material layer comprising a sandwich formed of a dielectric/Poly/dielectric ("D/P/D"). The D/P/D antifuse material layer is programmable over a range of about 6 volts–100 volts depending upon the materials and thicknesses used as would be known to those of ordinary skill in the art. The D/P/D antifuse material layer may be substituted in metal-to-metal antifuses as well as Poly to Poly antifuses or Poly to diffusion antifuses. As presently envisaged, the lower electrode may be diffusion, poly or barrier metals (e.g., titanium nitride ("TiN"), titanium-tungsten ("TiW"), etc.) or high temperature silicide which provides very high flexibility for process integration and potential for smaller product die size than current ONO based antifuse products. The upper antifuse electrode may be Poly or metals which is also very flexible for process integration and manufacturing.

The temperature constraints on the bottom electrode materials are (1) for metals, not to exceed about 420° C.; (2) for high temperature silicide, not to exceed about 750° C.; and for Poly or diffusion, not to exceed about 1000° C. These constraints are due to the high temperature causing possible diffusion of the electrode material into lower layers of the semiconductor device which could result in device failure.

Presently preferred is to carry out device processing in the range of 600–800° C. so that the highest quality films, particularly nitride films, may be deposited.

The dielectric layer of the antifuse material layer (18 and 20 in FIG. 1) may be formed of nitrides, oxides or combinations of nitrides and oxides. This structure permits the fabrication of controllable asymmetrical antifuses to meet product needs. Controllable asymmetrical antifuses will provide different voltages of the antifuse sandwich when programmed from different electrodes (i.e., top electrode programming vs. lower electrode programming). When antifuses on a chip are programmed, it is often desirable to apply a programming voltage to one of the electrodes, e.g., the top electrode, hold the bottom electrodes of the antifuses to be programmed at a low voltage relative to the top electrode, and hold the bottom electrodes of the antifuses that are not to be programmed at an intermediate voltage. Pulsing and AC soaking techniques may also be used. Nevertheless, with respect to the antifuses that are not to be programmed, they are exposed to some degree of stress during the programming operation of the antifuses to be programmed. By making the antifuses weaker in the direction of the applied programming voltage, stress is reduced on the antifuses not being programmed because the ones slated to be programmed program faster.

The Poly layer 22 may be doped or undoped polysilicon, as desired. By lightly doping the polysilicon, its breakdown voltage decreases. Lightly doped polysilicon is more resistive than heavily doped polysilicon (which has a sheet resistance of about 30 ohms per square) and less resistive than undoped polysilicon (with a sheet resistance of in excess of 1 Megohm per square). Thus heavily doped polysilicon is more conductive and may be used for an antifuse electrode. By increasing the thickness of the polysilicon layer, its breakdown voltage increases. Increasing the thickness of the polysilicon layer also decreases the capacitance presented by the antifuse (the antifuse is, in effect, a parallel plate capacitor and increasing the distance between the plates decreases capacitance). Thus the antifuse may be designed to have a particular programming voltage without paying the price of increased capacitance for reduced breakdown voltage. This can be achieved by simply increasing the doping level of the Poly layer without decreasing the thickness of the antifuse material layer. As a result, the designer now has an added dimension available with which to design antifuses.

Polysilicon is a non-TDDB film. It does not exhibit TDDB behavior. As a result, placing a layer of Poly in the antifuse material layer provides a barrier through which a TDDB failure cannot propagate. As a result, no TDDB failures are to be expected in optimized D/P/D antifuses.

It is to be understood that the present invention is not limited to only D/P/D embodiments. It is also possible to make use of the invention in a structure such as a D/P/D/P/D antifuse material layer (as shown at 14A in FIG. 2), a D/P/D/a-Si/D antifuse material layer (as shown at 14B in FIG. 3), and other versions and iterations of the foregoing.

A presently preferred embodiment of the present invention has a programming voltage range of about 6 volts to about 100 volts and a first dielectric layer formed of a nitride of thickness in the range of 10 Å–200 Å, a lightly doped Poly layer of thickness in the range of 50 Å–1000 Å, and a second dielectric layer formed of a nitride of thickness in the range of 10 Å–200 Å. Nitride has a breakdown voltage of about 5 volts per 100 Å, oxide has a breakdown voltage of about 15 volts per 100 Å and the breakdown voltage of the lightly doped Poly is dependent upon the doping level and would be known to those of ordinary skill in the art. Typical dopants are Arsenic, Phosphorous and Boron as is well known to those of ordinary skill in the art. The dopants can be added by conventional means such as by ion implantation, in situ doping or POCl₃ doping procedures as are known to those of ordinary skill in the art.

Where it is desirable to add an a-Si layer as discussed above, a presently preferred structure (FIG. 3) would have a first dielectric layer 34 of a nitride of thickness in the range of 10 Å–200 Å, a lightly doped Poly layer 36 of thickness in the range of 50 Å–1000 Å, a second dielectric layer 38 of a nitride of thickness in the range of 10 Å–200 Å, an a-Si layer 40 of thickness in the range of 50 Å–1000 Å, and a third dielectric layer 42 of a nitride of thickness in the range of 10 Å–200 Å. Note here that the breakdown voltage of a-Si is approximately 1 volt per 100 Å and the various layer thicknesses are to be adjusted to permit the desired breakdown voltage, currently contemplated in the range of 6 volts–100 volts. It is important in this embodiment (FIG. 3) to construct the Poly layer 36 below the a-Si layer 40 so that the highest processing temperatures (up to about 950° C.) may be used below the a-Si layer 40. Since a-Si layer 40 processing is limited to a maximum temperature of about 560° C., it is best to form this layer 40 above the Poly layer 36 and then process the third dielectric layer 42 at a temperature not to exceed 560° C. so as not to damage the a-Si layer 40.

Figure 2:
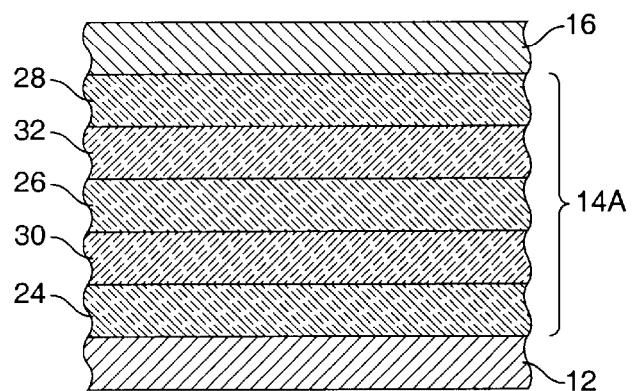
FIG. 2 is a figure of an antifuse in accordance with a second preferred embodiment of the present invention.
Figure 3:
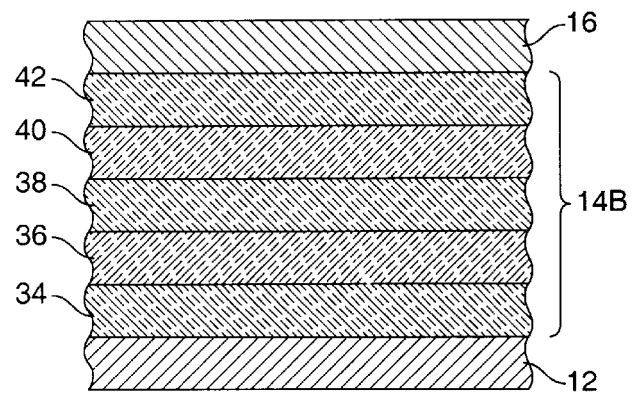
FIG. 3 is a figure of an antifuse in accordance with a third preferred embodiment of the present invention.

Similarly, where a D/P/D/P/D structure (as shown in FIG. 2) is desired, the presently preferred embodiment comprises a first (24), second (26) and third dielectric layer (28) of a nitride of thickness in the range of 10 Å–200 Å and a first (30) and second lightly doped Poly layer (32) of thickness in the range of 50 Å–1000 Å with the doping level selected to achieve the desired breakdown voltage as would be known to those of ordinary skill in the art.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An antifuse structure comprising:

a lower antifuse electrode;

an antifuse material layer disposed over and in electrical contact with said lower antifuse electrode; and an upper antifuse electrode disposed over and in electrical contact with said antifuse material layer;

said antifuse material layer including:

a first dielectric layer;

a first polysilicon layer disposed on said first dielectric layer;

a second dielectric layer disposed on said first polysilicon layer, said second dielectric layer being a single, continuous dielectric layer;

a second polysilicon layer disposed on said second dielectric layer; and a third dielectric layer disposed on said second polysilicon layer.

2. The antifuse structure according to claim 1 wherein said lower antifuse electrode is formed of a metal.

3. The antifuse structure according to claim 2 wherein said upper antifuse electrode is formed of a metal.

4. The antifuse structure according to claim 1 wherein said upper antifuse electrode is formed of a metal.

5. The antifuse structure according to claim 1 wherein said lower antifuse electrode is a diffusion region.

6. The antifuse structure according to claim 1 wherein said lower antifuse electrode is formed of heavily doped polysilicon.

7. The antifuse structure according to claim 6 wherein said upper antifuse electrode is formed of heavily doped polysilicon.

8. The antifuse structure according to claim 1 wherein said upper antifuse electrode is formed of heavily doped polysilicon.

9. An antifuse material layer for an antifuse comprising:

a first dielectric layer;

a first polysilicon layer disposed on said first dielectric layer;

a second dielectric layer disposed on said first polysilicon layer, said second dielectric layer being a single, continuous dielectric layer;

a second polysilicon layer disposed on said second dielectric layer; and a third dielectric layer disposed on said second polysilicon layer.

* * * * *